(12) United States Patent
Linden

(10) Patent No.: US 7,306,963 B2
(45) Date of Patent: Dec. 11, 2007

(54) PRECISION SYNTHESIS OF QUANTUM DOT NANOSTRUCTURES FOR FLUORESCENT AND OPTOELECTRONIC DEVICES

(75) Inventor: Kurt J. Linden, Wayland, MA (US)

(73) Assignee: Spire Corporation, Bedford, MA (US)

( * ) Notice: Subject to any disclaimer, the term of this patent is extended or adjusted under 35 U.S.C. 154(b) by 62 days.

(21) Appl. No.: 11/002,849

(22) Filed: Nov. 30, 2004

(65) Prior Publication Data

US 2006/0115917 A1  Jun. 1, 2006

(51) Int. Cl.
*H01L 21/00* (2006.01)
(52) U.S. Cl. .......................... 438/40; 257/13; 977/814
(58) Field of Classification Search ............... 257/13; 438/40; 977/814
See application file for complete search history.

(56) References Cited

U.S. PATENT DOCUMENTS

| | | | |
|---|---|---|---|
| 4,118,485 A | 10/1978 | Eriksson et al. | |
| 4,673,584 A | 6/1987 | Nygren et al. | |
| 5,057,313 A | 10/1991 | Shih et al. | |
| 5,142,385 A | 8/1992 | Anderson et al. | |
| 5,155,051 A | 10/1992 | Noguchi et al. | |
| 5,372,675 A * | 12/1994 | Wakabayashi et al. | 438/751 |
| 5,427,648 A | 6/1995 | Pamulapati et al. | |
| 5,782,908 A | 7/1998 | Cahalan et al. | |
| 6,066,204 A | 5/2000 | Haven | |
| 6,080,928 A | 6/2000 | Nakagawa | |
| 6,235,618 B1 | 5/2001 | Jeong-Sook et al. | |
| 6,319,738 B1 | 11/2001 | Yamashita | |
| 6,399,177 B1 | 6/2002 | Fonash et al. | |
| 6,406,745 B1 | 6/2002 | Talton | |
| 6,444,143 B2 | 9/2002 | Bawendi et al. | |
| 6,444,897 B1 | 9/2002 | Luque-Lopez et al. | |
| 6,514,772 B2 | 2/2003 | Siiman et al. | |
| 6,548,264 B1 | 4/2003 | Tan et al. | |

(Continued)

FOREIGN PATENT DOCUMENTS

WO  WO-03/087291 A2  10/2003

(Continued)

OTHER PUBLICATIONS

Jolly, Tim "Etching and Reactive beam etching" www.oichina.cn/product/oipt/News/ibe_ribe.pdf Oct. 2003.*

(Continued)

*Primary Examiner*—B. William Baumeister
*Assistant Examiner*—Matthew L. Reames
(74) *Attorney, Agent, or Firm*—Thomas J. Engellenner; Reza Mollaaghababa; Nutter McClennen & Fish, LLP

(57) ABSTRACT

Methods are disclosed generally directed to design and synthesis of quantum dot nanoparticles having improved uniformity and size. In a preferred embodiment, a release layer is deposited on a semiconductor wafer. A heterostructure is grown on the release layer using epitaxial deposition techniques. The heterostructure has at least one layer of quantum dot material, and optionally, one or more layers of reflective Bragg reflectors. A mask is deposited over a top layer and reactive ion-beam etching applied to define a plurality of heterostructures. The release layer can be dissolved releasing the heterostructures from the wafer. Some exemplary applications of these methods include formation of fluorophore materials and high efficiency photon emitters, such as quantum dot VCSEL devices. Other applications include fabrication of other optoelectronic devices, such as photodetectors.

27 Claims, 7 Drawing Sheets

U.S. PATENT DOCUMENTS

| | | | |
|---|---|---|---|
| 6,566,595 | B2 | 5/2003 | Suzuki |
| 6,584,130 | B2 | 6/2003 | Hanke |
| 6,585,947 | B1 | 7/2003 | Nayfeh et al. |
| 6,623,559 | B2 | 9/2003 | Huang |
| 6,632,694 | B2 | 10/2003 | Torvik |
| 6,689,338 | B2 | 2/2004 | Kotov |
| 6,750,016 | B2 | 6/2004 | Mirkin et al. |
| 6,756,477 | B1 | 6/2004 | Jiang et al. |
| 6,774,300 | B2 | 8/2004 | McFarland |
| 2002/0036055 | A1* | 3/2002 | Yoshimura et al. ......... 156/234 |
| 2002/0132101 | A1 | 9/2002 | Fonash et al. |
| 2003/0010973 | A1 | 1/2003 | Lorin et al. |
| 2004/0075083 | A1 | 4/2004 | Li et al. |
| 2004/0101822 | A1 | 5/2004 | Wiesner et al. |
| 2004/0154657 | A1 | 8/2004 | McFarland |
| 2005/0000565 | A1 | 1/2005 | Zeng |
| 2005/0087224 | A1 | 4/2005 | McFarland |
| 2005/0145596 | A1* | 7/2005 | Metz et al. ................... 216/13 |
| 2005/0233487 | A1 | 10/2005 | Lui et al. |
| 2006/0030068 | A1 | 2/2006 | Ashton et al. |
| 2006/0102227 | A1 | 5/2006 | McFarland |

OTHER PUBLICATIONS

Appelbaum, FR, "Antibody-targeted therapy for myeloid leukemia," *Semin Hematol*, 36(4 Suppl 6): 2-8 (Oct. 1999).

Trail, Pamela A. and Bianchi, Albert B., "Monoclonal Antibody Drug Conjugates in the Treatment of Cancer," *Current Opinion in Immunology*, 11:584-588 (1999).

Johnson, R. Colin, "Scientists Activate Neurons with Quantum Dots," *EE Times* (Dec. 6, 2001).

Mutzel, M. et al., "Atom Lithography with a Holographic Light Mask," *Physical Review Letters*, vol. 88, No. 8 (Feb. 25, 2002).

Wong, Ciintyu; Burgess, Joel P., "Modifying the Surface Chemisty of Silica Nano-Shells for Immunoassays," *Journal of Young Investigators*, Issue 1 (Jul. 2002).

Trail, Pamela A.: King, H. Dalton, Dubowchik, Gene M., "Monoclonal Antibody Drug Immunoconjugates for Targeted Treatment of Cancer," *Cancer Immunol Immunother*, 52:328-337 (2003).

Odornina, Sveltana et al., "Development of Potent Monoclonal Antibody Auristatin Conjugates for Cancer Therapy," *Nature Biotechnology*, vol. 21, No. 7, pp. 778-784, 941 (2003).

Kaul, Zeenia et al., "Mortalin Imaging in Normal and Cancer cells with Quantum Dot Immuno-Conjugates," *Cell Research*, 13(6): 503-507 (2003).

Sesay, Muctarr Ayoub PH.D., "Monoclonal Antibody Conjugation via Chemical Modification," BioPharm International (Dec. 1, 2003).

Adams, Gregory P. Ph.D., et al. "Antibody-Based Therapy and Detection of Solid Tumors," Fox Chase Center 2003 Scientific Report.

Technical Resource, "Attach an Antibody Onto Glass, Silica or Quartz Surface," Pierce Biotechnology, Inc. (Apr. 2004).

Harris, Marion, "Monoclonal Antibodies as Therapeutic Agents for Cancer," *The Lancet Oncology*, vol. 5, pp. 292-302 (May 2004).

Clube, FSM; Gray, S.; Struchen, D.; Tisserand, J. C.; Malfov, S., "Holographic Micolithography," Holotronic Technologies Ltd., Marin, Switzerland (accessed May 3, 2004).

Cattel, L., "Monoclonal Antibody as Carriers for Drug Targeting and Gene Tharapy," University of Turin (accessed Jul. 6, 2004).

Leonard, John P. MD. "Cutting Edge Therapy: Monclonal Antibody Treatment for Non-Hodgkin's Lymphoma," Lymphoma Information Network (1998-2001).

Ouellette, Jennifer. "Quantum Dots for Sale," American Institute of Physics (Feb./Mar. 2003).

\* cited by examiner

PRECISION SYNTHESIS OF QUANTUM DOT NANOSTRUCTURES FOR FLUORESCENT AND OPTOELECTRONIC DEVICES

FIELD OF THE INVENTION

The present invention is directed generally to methods for producing semiconductor nanostructures, and more particularly, to such methods for large scale production of quantum dot particles having enhanced size uniformity.

BACKGROUND OF THE INVENTION

Quantum dots are nanometer-sized or micrometer-sized semiconductor structures in which one to a few thousand charge carriers (e.g., electrons) are confined. Such structures are useful in a variety of optical applications because they exhibit narrow spectral emission properties and rapid excited electron decay rates. In device structures, quantum dots possess superior optical properties, in part because they can provide three-dimensional electron confinement.

Quantum dots can be employed in a variety of electronic applications, e.g., to form lasers, LED devices, and photo-detectors. Further, the small size of these structures make them particularly useful in assays, diagnostic systems and therapeutic compositions.

Quantum dots can be utilized in numerous biological applications, such as genomics and proteomics, as fluorescent biomarkers. For example, quantum dots can be linked to, or conjugated with, bioactive agents having an affinity to specific cells, e.g., cells having a particular malignancy. The coated quantum dots can be applied to tissue samples suspected of having such cells to attach to the selected cells, if present. Any quantum dots not attached to a cell can be washed away. Subsequently, an excitation source, e.g., a laser, illuminate the sample to cause the remaining quantum dots, which are attached to the cells, to emit a detectable emission.

Similar to the optoelectronic applications, it is desirable in biological applications that the quantum dots exhibit size uniformity and narrow spectral emissions. However, despite many recent advances in fabricating quantum dots, large scale production of quantum dots having size uniformity, in a controllable manner, has proven difficult. Currently available quantum dots typically suffer from size non-uniformities that can result in spectral broadening and weakening of photon emission.

Hence, it is desirable to provide methods for generating a plurality of quantum dots having enhanced size uniformity. It is also desirable to provide such methods that allow generating quantum dots in a controllable and reproducible manner.

SUMMARY OF THE INVENTION

In one aspect, the present invention provides a method of generating quantum dot structures having enhanced size uniformity by initially depositing a release layer on a semiconductor substrate, e.g., a GaAs substrate, followed by forming a semiconductor heterostructure, which provides a one-dimensional confinement of selected charge carriers therein, on the release layer. A mask can be applied to the surface of the heterostructure to form a pattern of exposed and unexposed portions thereon. The exposed portions are then removed to generate a plurality of separate heterostructure elements, each disposed on a portion of the release layer. As a result of this partial removal process, a highly porous heterostructure remains with the heterostructure layer reduced to an array of individual pillars or columns on the substrate with the release layer separating the heterostructure from the substrate.

After patterning the heterostructure layers, the release layer can be dissolved to release the heterostructure elements as a plurality of individual quantum dots. Following release, each of the separate heterostructure elements, which will typically be columnar or barrel-shaped, provides a nanostructure with three-dimensional confinement of the charge carriers.

In another aspect, in the method described above, the semiconductor heterostructures can be formed by depositing one or more layers of Group IV, III-V or II-VI semiconductors on the release layer. For example, the heterostructure layer can be formed by depositing successive layers of GaAs, GaAlAs, and GaAs on the release layer. Each deposited layer can have a thickness in a range of about 2 nm to about 300 nm based on desired properties of the quantum dots generated in subsequent processing steps. Typically, AlAs would be used as a release layer because it readily dissolves in water. The formation of a semiconductor heterostructure on the release layer can be accomplished by employing any suitable technique known in the art, such as molecular beam epitaxial growth or chemical vapor deposition. Other Group III-V semiconductor materials, such as GaAsSb, AlAsSb, InAsSb, can be used on GaSb substrates, with thin AlAs release layers.

In another aspect, the mask applied to the semiconductor heterostructure can be formed by application of nanoparticles, such as nano-sized gold spheres, to the upper surface of heterostructure. Each of these masking particles is capable of locally blocking a reactive ion beam or other etching process. For example, a colloidal solution of metallic, ion-blocking particles can be dispersed on a top surface of the heterostructure to generate a pattern of exposed and unexposed areas. It should be appreciated other masks suitable for use in the practice of the invention are readily known to those having ordinary skill in the art.

Semiconductor heterostructures can also be formed from silicon by appropriate deposition of layers of doped and undoped compositions. Such structures can also include P/N junctions and the like.

In other aspects, the release layer can be formed by utilizing a Group III-V semiconductor compound. For example, the release layer can be an AlAs layer, which can be removed, if desired, by dissolution in a suitable solvent, such as water. Other dielectric materials can also be deposited as pseudomorphic (e.g., strain-inducing) layers to function as release layers. For example, materials such as $SiO_2$, SiO, $Si_3N_x$, or other materials that can be dissolved in liquids or gases that do not attack the semiconductor matrix in which these layers are present. The release layer can be formed by employing any suitable technique known in the art, for example, molecular beam epitaxial growth.

The quantum dot structures generated by utilizing a method according to the teachings of the invention, such as those described above, can be designed to exhibit fluorescence in the visable or infrared (IR) portion of the electromagnetic spectrum, or other desired wavelength bands. Further, the mask utilized in one of the processing steps can be selected such that the sizes of the quantum dot structure vary by less than a few percent. Such size uniformity provides a number of advantages. For example, it allows generating a collection of quantum dot structures that exhibit substantially similar, and preferably identical, emission spectra.

In another aspect, the invention provides a method of generating heterostructures with one or more reflective layers that enhance the optical properties of the quantum dots. This method can also begin with the deposition of a release layer on a semiconductor substrate, e.g., a n-doped or p-doped GaAs substrate. Subsequently a first reflective semiconductor heterostructure is generated over the release layer followed by forming a quantum well heterostructure layer on the reflective structure. Subsequently, a second reflective semiconductor heterostructure layer can be formed over the quantum well layer. A mask is applied to a top surface of the second reflective layer to generate a pattern of exposed and unexposed portions. The exposed portions are again removed to generate a plurality of heterostructure pillars, each including a portion of the quantum well heterostructure disposed on a portion of the release layer. Subsequently, the release layer can be dissolved, if desired, to release the semiconductor pillars as separate quantum dot structures. Each quantum dot structure can include a quantum dot, which provides a three-dimensional confinement of selected charged carriers therein, surrounded by optically reflective nano-structures.

In a further aspect of the invention, large scale production of active nanostructures can be achieved by repeating the process of deposing a release and heterostructure several times such that the pillars are formed after etching will provide stacks of precursor quantum dots, each of which can be separated upon dissolution of the intervening release layers.

Further understanding of the invention can be obtained by reference to the following detailed description in conjunction with the associated drawings, described briefly below.

DETAILED DESCRIPTION OF THE INVENTION

The invention is generally directed to design and synthesis of quantum dot structures, e.g., quantum dot nanoparticles, having improved size uniformity. The terms "nanoparticles," "nanostructures," and "quantum dots" are used interchangeably herein to describe materials having dimensions of the order of one or a few nanometers to a few micrometers, more preferably from about 1 to about 100 nanometers of active device structure that possesses optical properties derived from the excitation of a confined population of charge carriers.

In general, in a method of the invention for generating quantum dot nanoparticles, a release layer is deposited on a semiconductor wafer followed by deposition of additional layers that form a heterostructure providing a one-dimensional confinement of electrons or other charge carriers. A plurality of ion-blocking nano-particles, e.g., gold particles, are disposed on a top surface of the wafer to form a mask for protecting portions of the heterostructure from subsequent etching steps. The heterostructure can then be etched to remove the exposed portions, i.e., those portions not protected by the particles, to create a plurality of heterostructure elements, each containing at least one quantum dot nanoparticle that provides a three-dimensional confinement of the charge carriers. The release layer can be dissolved, for example, by dissolution in a suitable solvent, to release the nanoparticles as separate quantum dot structures.

Figure 1:
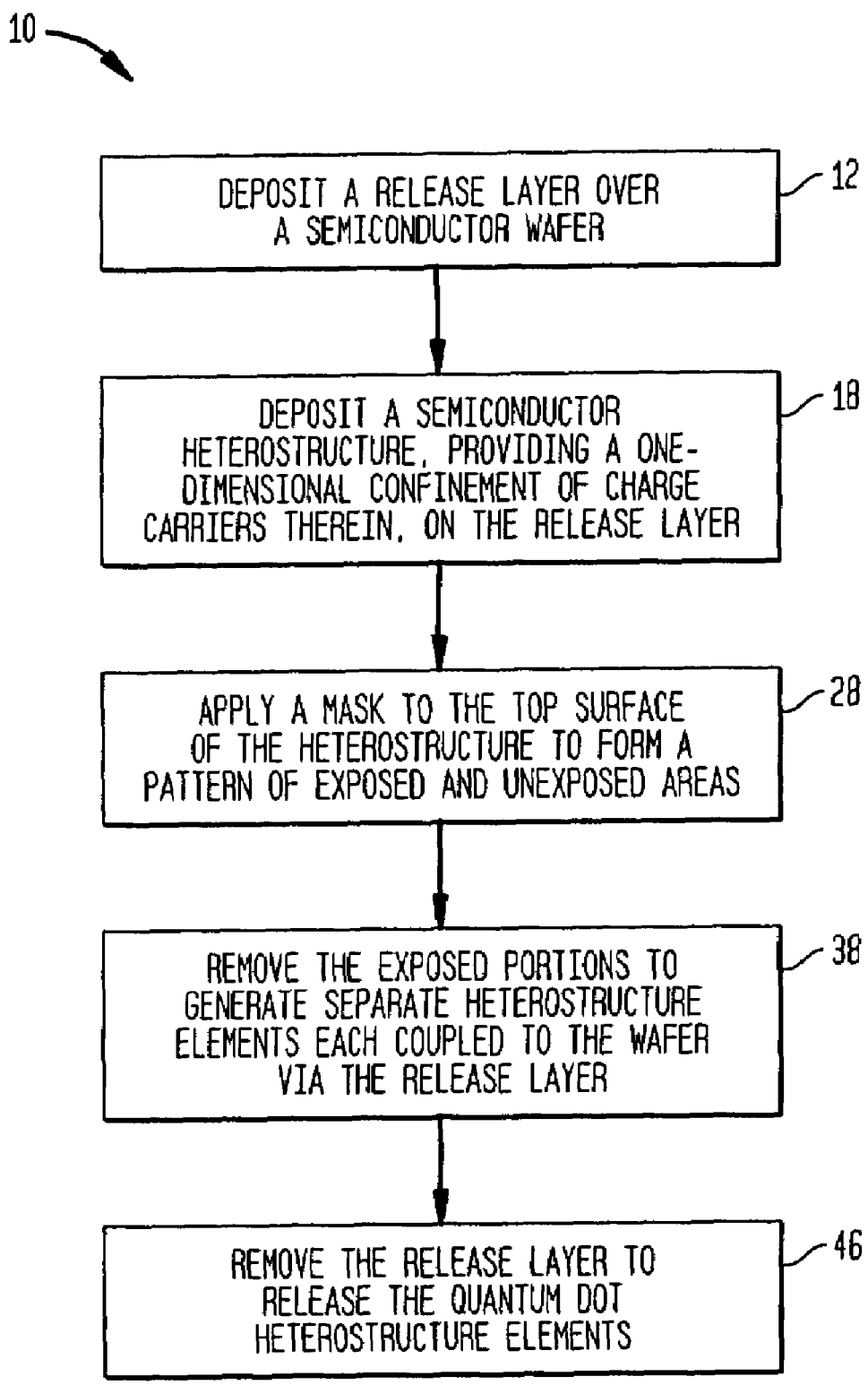
FIG. 1 is a flow chart describing steps of a method according to the invention for synthesis of a quantum dot heterostructure, FIGS. 2A-2D schematically illustrate semiconductor structures formed at various steps of one embodiment of a method of the invention for synthesizing quantum dot structures, FIG. 3A schematically illustrates a plurality of columnar structures each having a stack of quantum dot elements separated from an adjacent element and/or an underlying substrate by a release layer, FIG. 3B schematically illustrates a heterostructure from which the quantum dot elements of FIG. 3A can be generated by employing, for example, reactive ion etching, FIG. 4 schematically illustrates a columnar heterostructure generated in accordance with the teachings of the invention and having a quantum dot surrounded by Bragg reflectors, FIG. 5 schematically illustrates a plurality of columnar heterostructures each having a quantum dot surrounded by Bragg reflectors.
Figure 2A:
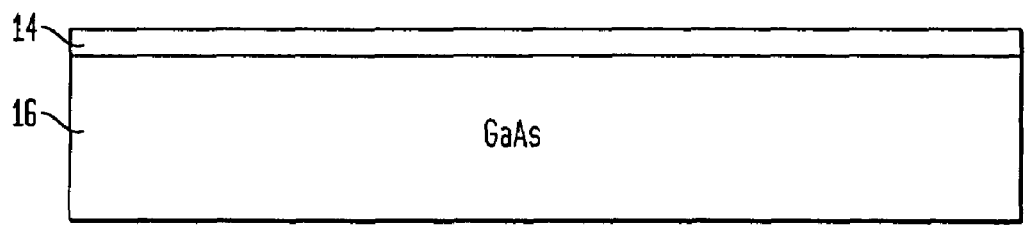

With reference to a flowchart 10 of FIG. 1 as well as FIG. 2A, in an exemplary method according to the teachings of the invention for synthesizing quantum dot structures having uniform and controllable sizes, in an initial step 12, a release layer 14 is deposited on a semiconductor substrate 16. Although in this embodiment, the semiconductor substrate 16 is a GaAs wafer, in other embodiments, the semiconductor substrate 16 can incorporate other Class III-V semiconductor materials, for example, InGaAs, InGaSb, AlGaSb, or AlGaAs, particularly for generating quantum dot structures suitable for near-infrared applications. These materials can be readily grown by MOCVD or MBE epitaxial growth techniques on GaAs, InP, or GaSb substrate wafers.

More generally, semiconductors useful in producing the quantum dots of the present invention can include Group II-VI, III-V and group IV semiconductors. (Alternatively, using the new IUPAC system for numbering element groups, suitable semiconductor materials include, but not limited to, the following: materials composed of a first element selected from Group II of the Periodic Table of the Elements and a second element selected from Group VI (e.g., ZnS, ZnSe, ZnTe, CdS, CdSe, CdTe, HgS, HgSe, HgTe, MgS, MgSe, MgTe, CaS, CaSe, CaTe, SrS, SrSe, SrTe, BaS, BaSe, BaTe, and the like); materials composed of a first element selected from Group III of the Periodic Table of the Elements and a second element selected from Group V (GaN, GaP, GaAs, GaSb, InN, InP, InAs, InSb, AlS, AlP, AlAs, AlSb, and the like); materials composed of a Group IV element (Ge, Si, and the like);Group IV-VI materials such as PbS, PbSe and the like; and alloys and mixtures (including ternary and quaternary mixtures) thereof.

The release layer 14 is preferably an evenly deposited layer that can be easily dissolved, thus releasing any structures disposed thereon. In the illustrated embodiment, the release layer 14 is an AlAs layer that can be removed, for example, by dissolution in steam or water, to release quantum dot structures/elements deposited thereon from the wafer, as described in more detail below. It will be appreciated, however, that other compositions for the release layer can also be selected based on the composition of the wafer and the structures disposed on the release layer. For example, the release layer can be formed by utilizing other Group III-V compounds, or by employing dielectric materials deposited on the substrate as pseudomorphic layers.

The release layer 14 can be deposited on the semiconductor wafer 16 by employing any known deposition technique, e.g., chemical vapor deposition, molecular beam epitaxy, or thermal evaporation.

Figure 2B:
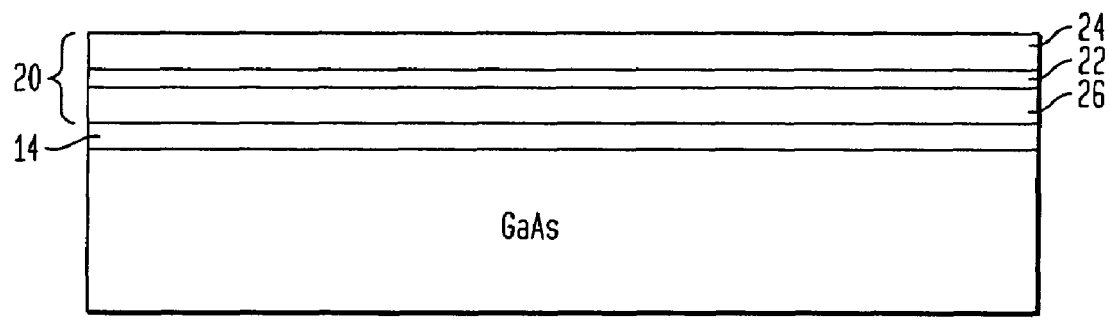

Referring to FIG. 1 and FIG. 2B, in a subsequent step 18, a heterostructure 20 can be deposited on the release layer 14 to provide a one-dimensional confinement of electrons or other charge carriers therein. In the illustrated embodiment, the heterostructure 20 includes a one-dimensional quantum well layer 22 sandwiched between two confinement layers 24 and 26 that provide confinement of selected charged carriers, such as electrons, within the quantum well layer. The term "quantum well" is known in the art. To the extent that a definition may be needed, a "quantum well," as used herein, refers to a generally planar semiconductor region, having a selected composition, that is sandwiched between semiconductor regions (typically referred to as barrier or confinement layers) having a different composition, commonly selected to exhibit a larger bandgap energy than that of the composition of the quantum well layer. The spacing between the barrier layers, and consequently the thickness of the quantum well layer, is selected such that charge carriers (e.g., electrons) residing in the quantum well layer exhibit quantum effects in a direction perpendicular to the layer (e.g, they can be characterized by staircase-like quantized energy levels).

In this exemplary embodiment, the one-dimensional quantum well layer 22 is formed of InGaAs while the confinement layers 24 and 26 are formed of GaAs or AlGaAs. The quantum well layer 22 can have a thickness in a range of about 1 nanometer to about a few hundred nanometers, and more preferably, in a range of about 2 nm to about 20 nm, while each of the confinement layers 22 and 26 can have a thickness in a range of about hundreds of nanometers. Those having ordinary skill in the art will appreciate that rather than utilizing InGaAs and GaAs for forming the heterostructure layer 20, other semiconductor elements, particularly other Group III-V elements, can be utilized. Alternatively, Group IV-Group II-VI and Group IV-VI semiconductor materials can be utilized.

The heterostructure 20 can have a height ranging from about 2 nm to about 20 nm. It will be appreciated that the dimensions of the heterostructure 20 can be selected based on desired properties of quantum dot structures fabricated in subsequent processing steps, discussed in more detail below. For example, various dimensions of the heterostructure 20 can be selected in a manner known in the art to ensure that the quantum dot structures will exhibit a desired emission spectrum. Further, the thickness of various layers forming the heterostructure can be selected to allow an ion beam, utilized in subsequent etching steps, to sufficiently penetrate and etch away selected portions of the heterostructure, as will be discussed below.

The quantum well layer 22 and the confinement layers 24, 26 can be deposited on the wafer by employing a variety of techniques, such as organic chemical vapor deposition (MOCVD), and molecular beam epitaxial growth. It will be appreciated that MOCVD is particularly suitable for depositing Group III-V semiconductor materials on the wafer. By way of example, U.S. Pat. No. 6,066,204, owned by the assignee of the present application and incorporated herein by reference, discloses methods and apparatus for epitaxial deposition techniques that can be utilized for generating the heterostructure layer 20.

Figure 2C:
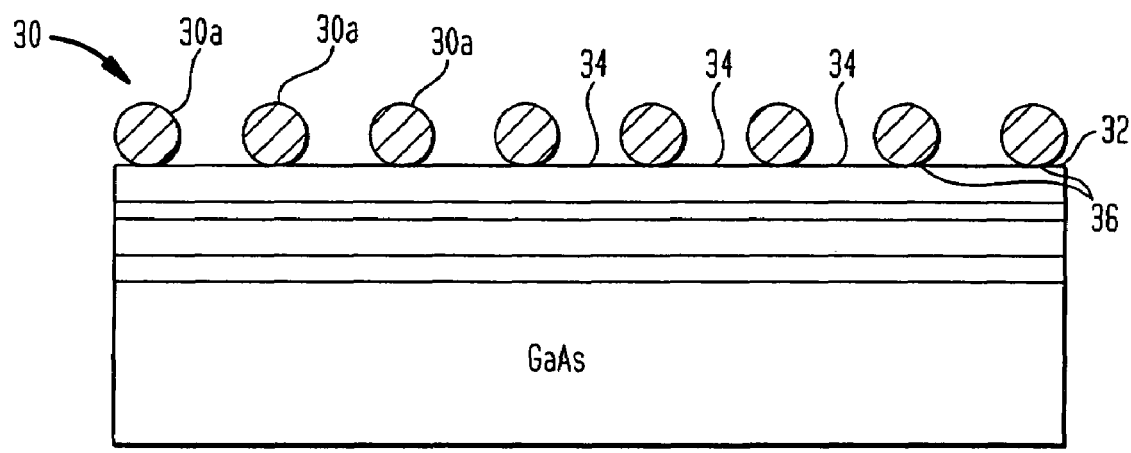

Referring again to the flowchart of FIG. 1 as well as FIG. 2C, in a subsequent step 28, a mask 30 is applied to an upper surface 32 of the heterostructure 20 to form a pattern of exposed 34 and unexposed 36 areas. The mask 30 preferably protects the unexposed portions from a subsequent etching step to which the wafer will be subjected, as described below. The mask 30 can be formed by employing a variety of different techniques. For example, the mask 30 can be formed as a collection of precision spheres 30a having nanometer-sized radii (herein referred to as nanospheres) that can be deposited on the top surface of the heterostructure so as to protect selected portions of the heterstructure from subsequent ion beam bombardment, described below, while leaving the other portions exposed. The nanospheres can be formed, for example, of gold or any other suitable material, e.g., in a colloidal solution that can be spread over a top surface of the heterostructure. Precision nano-sized gold spheres suitable for use in practicing the methods of the invention can be obtained, for example, from Accurate Chemical Scientific Corporation of Westbury, N.Y. in 1, 5, 10, 15 and 20 nm sizes.

Figure 2D:
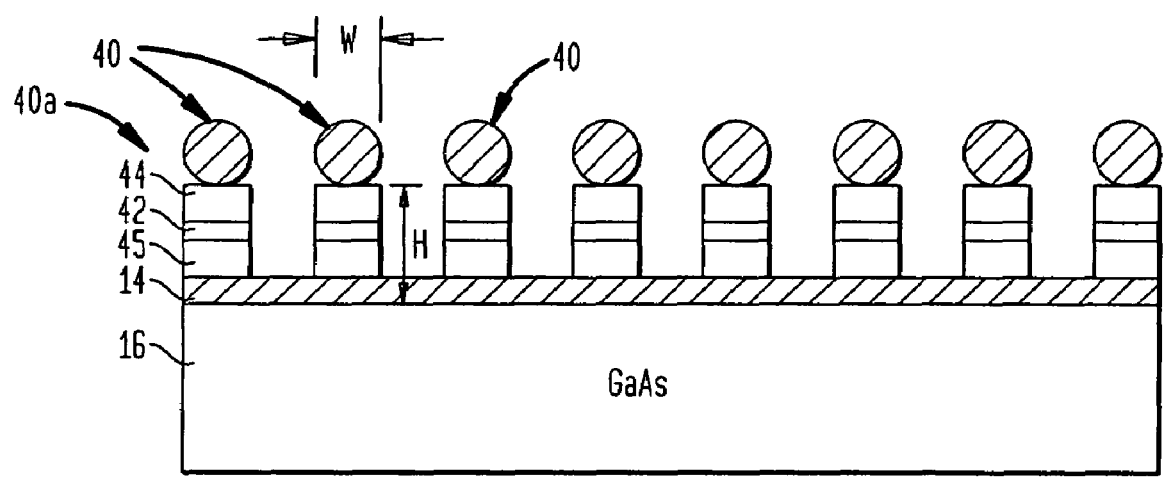

Referring now to both FIG. 1 and FIG. 2D, in a subsequent step 38, the exposed portions 34 of the heterostructure 20, e.g., the portions not shielded by the mask, are removed to generate separate heterostructure elements 40, e.g., element 40a, coupled to the substrate 16 via the release layer 14. By way of example, the wafer can be irradiated with an ion beam having a sufficient energy that etches away the exposed portions of the heterostructure without removing the release layer. For example, reactive ion etching techniques and apparatus for removing the exposed portions are known in the art. Alternatively, the etching step can remove not only the exposed portions of the heterostructure but also portions of the release layer by which these exposed portions are coupled to the underlying substrate.

During the ion etching process, the mask 30 will protect the unexposed portions of the wafer so as to allow generating the plurality of columnar heterostructure elements 40. Each heterostructure element 40 includes a portion of the one-dimensional quantum well layer 22 (See FIG. 2B) that has been turned into a three-dimensional quantum well, such as exemplary three-dimensional quantum well 42 sandwiched between confinement portions 44 and 45. The term "columnar" as used herein is intended to encompass both regular and irregular pillar-like or mesa-like structures formed as a result of etching the heterostructure. Although vertical walls are often desirable, they are not necessary. The columns so formed will vary based on the masking and etching techniques used.

The combination of the three-dimensional quantum well and its associated confinement portions is herein referred to as a quantum dot or a quantum nanoparticle. If desired, the masking nano-particles remaining on each of the quantum dot elements can be removed. It should be clear that various other masking techniques can be employed prior to etching. Preferably, the mask pattern is regular (or sufficiently random to achieve uniformity) such that the majority of the quantum dots vary in width by less than 25 percent, preferably less than 10 percent more preferably less than 5 percent.

Each quantum dot element 40 can have a width W in a range of about 1 nm to about 50 nm, and more preferably, in a range of about 2 nm to about 20 nm, and a height H in a range of about 1 nm to about 50 nm, and more preferably, in a range of about 2 nm to about 20 nm. While the height of the quantum dot elements is determined by the parameters utilized for deposition of various semiconductor layers in a manner known in the art, the width of each quantum dot element is determined by selection of the mask 30, for example, by the size of nanospheres forming the mask.

Referring again to the flow chart 10 of FIG. 1, in a step 46, the release layer 14 can be removed, if desired, to release the individual heterostructure quantum dot elements, from the underlying substrate. The term "dissolving" and its derivatives as used herein the context of removing the release layer is intended to encompass not only wet solubility techniques, but also various other methods, such as differential plasma etching and the like, as known in the art. In this embodiment, the nanospheres can remain on the quantum dots upon their release from the wafer 16. In other embodiments, the portions of the mask 30 remaining on the top surface of the quantum dot structures after the ion beam etching step can be removed, for example, by dissolution in a suitable solvent before removing the release layer.

The above process for generating quantum dot structures advantageously ensures that not only such structures can be generated in desired sizes in a controlled manner, but also a substantial size uniformity of the quantum dot structures can be obtained. For example, methods of the invention, such as those described above, can be employed to generate a collection of quantum dot structures that exhibit size variations less than about 20%, and more preferably, less than about 5%. One advantage of such size uniformity is that the generated quantum dot structures can exhibit substantially similar emission spectra and, collectively, narrow emission linewidths, thus rendering these structures particularly suited for use in a variety of applications and incorporation in a variety of devices. If desired, the quantum dot structures can be placed through a suitable filtering apparatus or separated by centrifuge to isolate a uniform sized set of particles.

The quantum dot nanoparticles and nanostructures synthesized using the methods disclosed herein can be used for a wide variety of applications. For example, biomarkers, fiber optics, communications, photon detection, and laser energy generation are a few exemplary technology areas that can utilize quantum dot nanostructures synthesized according to the teachings of the invention. Further, the methods described above are suitable for semiconductor materials of class III-V, as well as others including Group IV silicon and germanium, as well as Group II-VI and Group IV-VI as will be noted below.

In one application, quantum dot structures of the invention can be utilized as fluorophore materials that emit radiation, for example, in response to an external stimulus (e.g, UV or blue radiation), in the visible or near-IR spectral region of the electromagnetic spectrum. For example, for near-IR radiation, typical quantum dots having sizes in the range of about 20 nm to about 50 nm, depending on the material composition of the dots, can be employed. Unlike organic fluorophores that typically degrade with time and upon exposure to UV radiation, fluorophores generated by employing the quantum dot structures of the invention remain stable and functional over long periods. Further, fluorphores formed according to the invention can emit luminescence radiation in a much narrower spectral bandwidth than that typically associated with organic fluorophores (for example, bandwidths around 5-10 nm full width at half maximum (FWHM) compared with values of about 50 nm FWHM for typical organic fluorophores, such as Alexa Fluor fluorophores), and also in a narrower spectral widths than those associated with fluorophores formed as a collection of conventional quantum dots exhibiting dimensional variability.

Having a basic understanding of the above teachings, it is now possible to understand varying embodiments of the invention having, for example, heterostructures of multiple layers as will now be described.

Figure 3A:
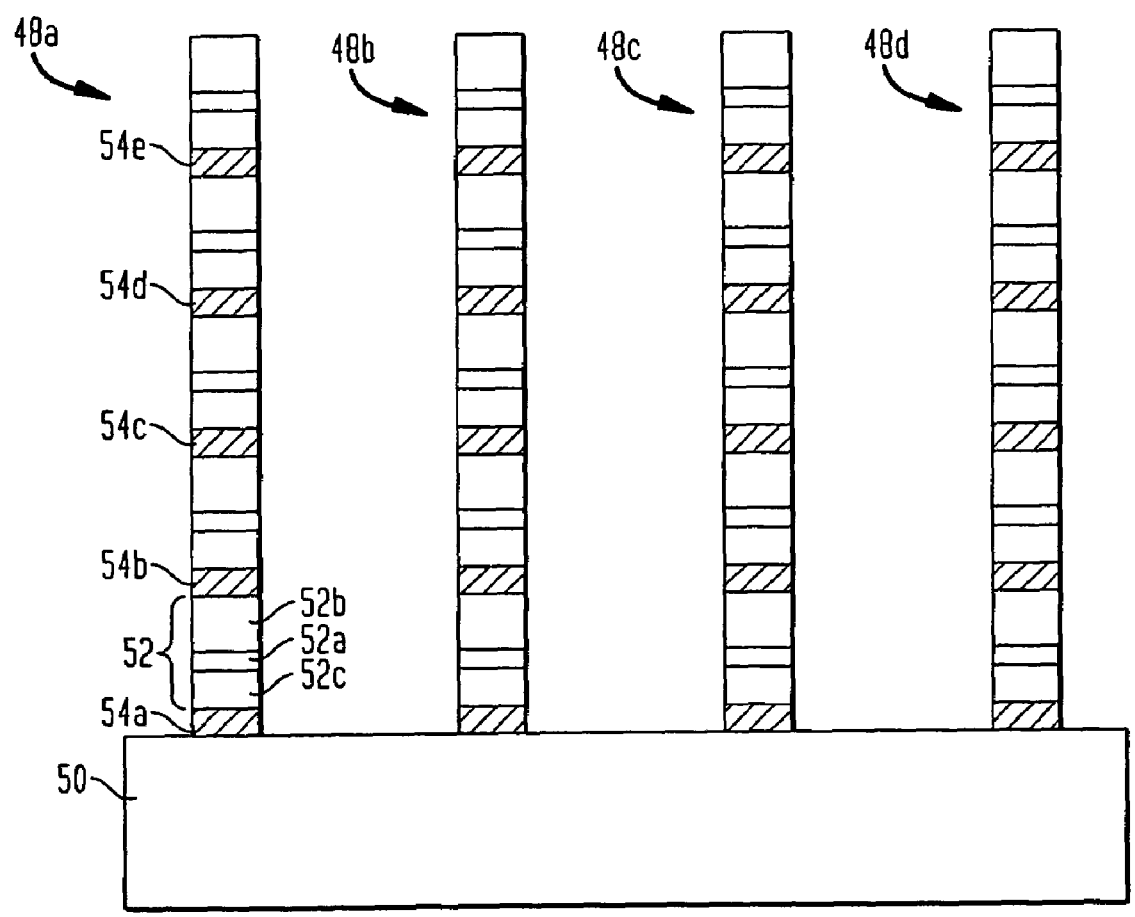

FIG. 3A schematically illustrates a plurality of columnar semiconductor structures or pillars 48a, 48b, 48c, 48d, herein collectively referred to as pillars 48, that are disposed on a wafer 50, formed in accordance the teachings of the invention. Each columnar structure is formed as a stack of a heterostructure repeat unit, e.g., repeat unit 52, that includes a three-dimensional quantum well, e.g., quantum well 52a, that is sandwiched between two confinement layers, e.g., confinement layers 52b and 52c. Each repeat unit is separated from an adjacent repeat unit, and/or from the wafer 50, by a semiconductor release layer, such as, release layers 54a, 54b, 54c, 54d, and 54e. Although each pillar in this embodiment includes five repeat units, those having ordinary skill in the art will appreciate that the pillars can be constructed with other numbers of repeat units to generate pillars having a desired height. The release layers can be dissolved, e.g., by employing a suitable solvent, to release the repeat units an individual quantum dot structures. A typical such solvent for the Group III-V compound semiconductor material AlAs would be water or steam.

Figure 3B:
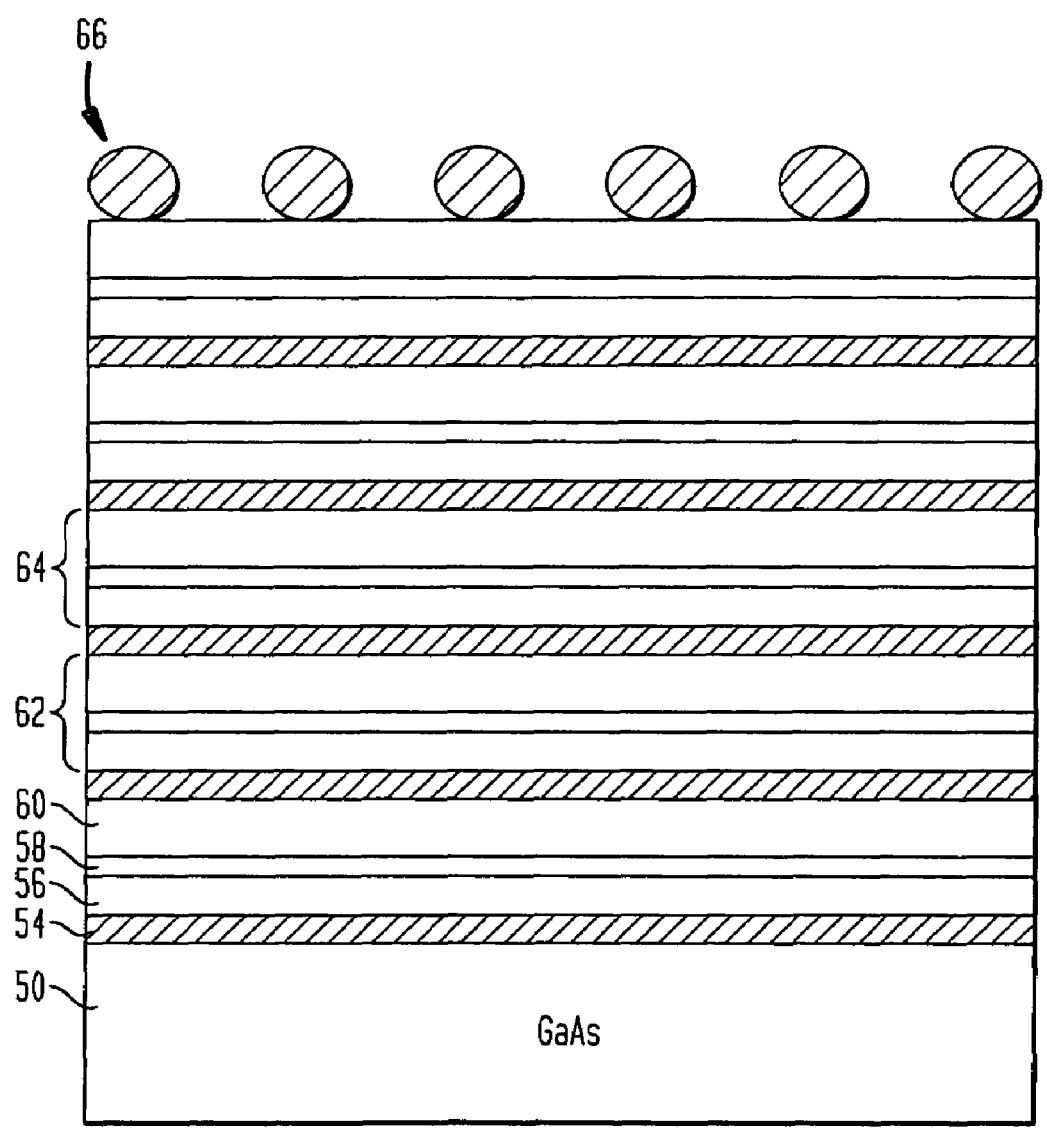

An epitaxial growth process, similar to that described above in connection with the previous embodiment, can be utilized to form the semiconductor pillars 48. More particularly, with reference to FIG. 3B, initially, a release layer 54, e.g., an AlAs layer, is deposited over a surface of the semiconductor wafer 50 (e.g., a GaAs). This is followed by deposition of layers 56, 58 and 60 to form a heterostructure from which the first repeat unit of the pillars 48 will be generated, as described below. The layers 56 and 60, which can be formed of AlGaAs, function as confinement layers to render the intervening layer 58, e.g. AlGaAs of lower Al compositional content, or GaAs, or InGaAs, or other similar, small bandgap material, a one-dimensional quantum well layer.

Subsequently, other heterostructure layer groups, e.g., layers 62 and 64, are generated in a similar manner such that each heterostructure layer group is separated from an adjacent layer group by a release layer.

A mask 66, e.g., formed by a collection of masking nanoparticles, e.g. a suspension of nanometer-sized gold spheres, is then applied to a top surface of the heterostructure to generate a pattern of exposed and unexposed portions. The exposed portions are etched away, for example, by employing reactive ion etching, to generate the semiconductor pillars shown in FIG. 3A. The mask can be removed, If desired. Further, the portions of the release layers separating the repeat units from one another can be dissolved to release the repeat units as individual quantum dot structures.

Figure 4:
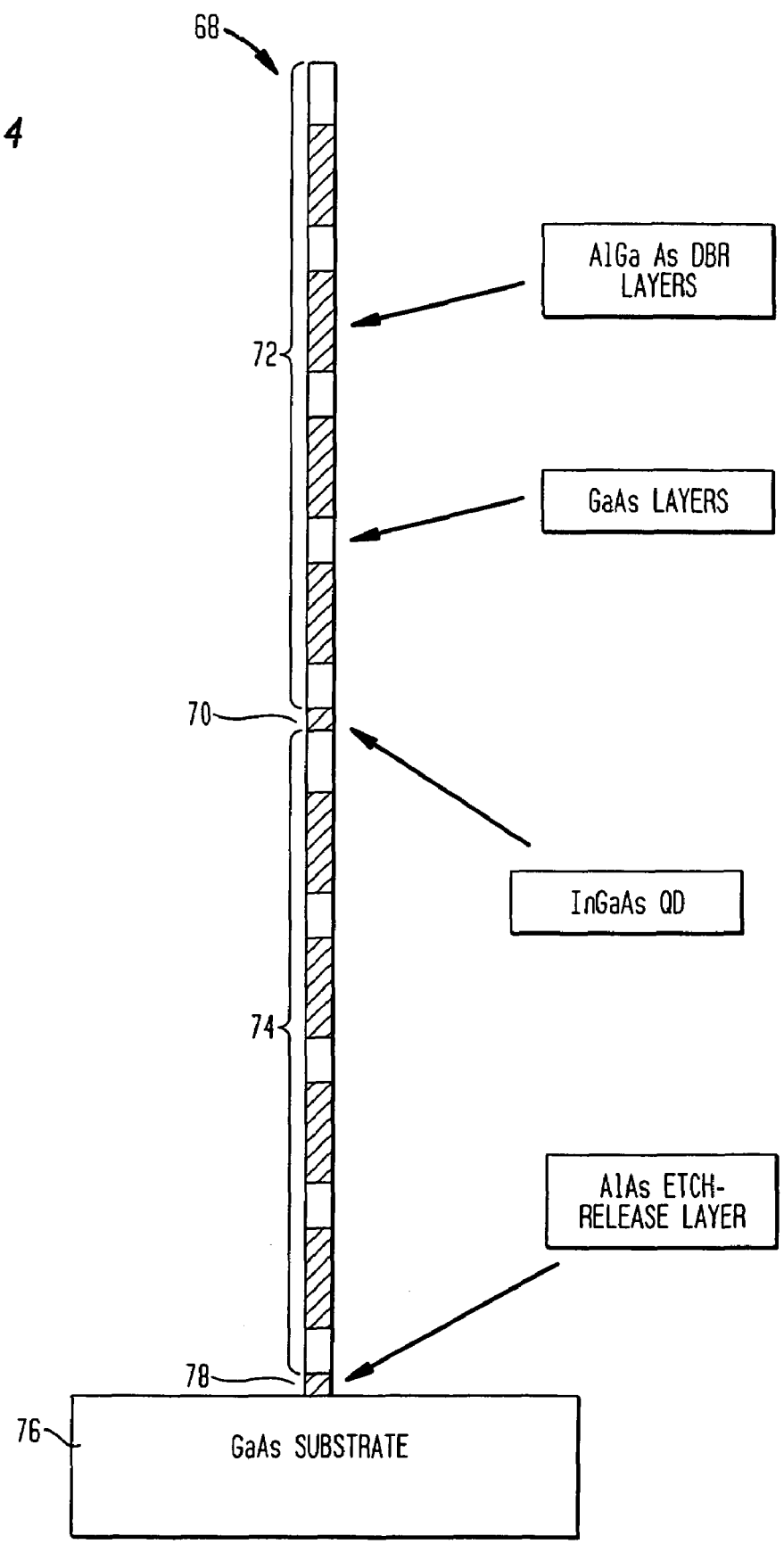

The quantum dot structures that can be formed according to the teachings of the invention are not limited to those described above. For example, FIG. 4 schematically illustrates a pillar 68 formed as a stack of semiconductor layers that include a quantum dot 70, formed, for example, as a quantum well portion sandwiched between two confinement portions, surrounded by two multi-layer distributed Bragg reflectors 72 and 74. Each Bragg reflector layer can be formed as an alternating stack of GaAs and AlGaAs layers, with typical layer thicknesses of hundreds of nanometers, depending on a desired luminescence wavelength. The pillar 68 is coupled to a wafer 76 via a release layer 78, which can be removed (e.g., by dissolution in a suitable solvent) to release the pillar 68. The exemplary heterostructure pillar 68 can have a height H of hundreds of nanometers, and can have a width W in range of about 2 nm to about 50 nm.

The Bragg reflectors can be formed to reflect radiation in a selected wavelength band. For example, the thickness of the alternating GaAs and AlGaAs layers forming each Bragg reflector can be selected in a manner known in the art to ensure that they reflect radiation in a desired wavelength range. In this manner, the two Bragg reflectors of each pillar form an optical cavity for light emitted from the respective quantum dot 70, for example, in response to an external stimulus. By way of example, in some applications, the quantum dot of each pillar can be designed to exhibit fluorescence in response to an exciting radiation. In such cases, the optical cavity formed by the Bragg reflectors can amplify the emitted fluorescence signal. The Bragg reflectors have preferably a reflectivity that is greater than about 90% in a desired wavelength range, and more preferably, a reflectivity in a range of about 96% to about 99.99%. It should of course be appreciated that the reflectivity of the Bragg reflectors can be adjusted based on the number of Bragg pairs used in the structure. Further, although in the above embodiments, the Bragg reflectors are formed as an alternating stack of GaAs and AlGaAs layers, those having ordinary skill in the art will appreciate other suitable materials can also be employed for forming the Bragg reflectors.

The exemplary pillar 68 can be formed by employing deposition techniques according to the teachings of the invention described above. For example, the pillar 68 can be generated by initially depositing two dimensional layers corresponding to the release layer, first Bragg reflector layers, the quantum well layer and its associated confinement layers, and the second Bragg reflector layers on the wafer to form a two-dimensional heterostructure stack to be processed in subsequent steps. For example, subsequently, nanometer-sized ion blocking spheres can be disposed on the top surface of the two-dimensional heterostructure stack to block selected areas thereof in order to generate a pattern of exposed and unexposed areas. Reactive ion beam etching can then be utilized to remove the exposed portions, thereby generating the pillar 68. If desired, the release layer can be dissolved to release the pillar from the wafer as individual quantum dot nanoparticle.

Figure 5:
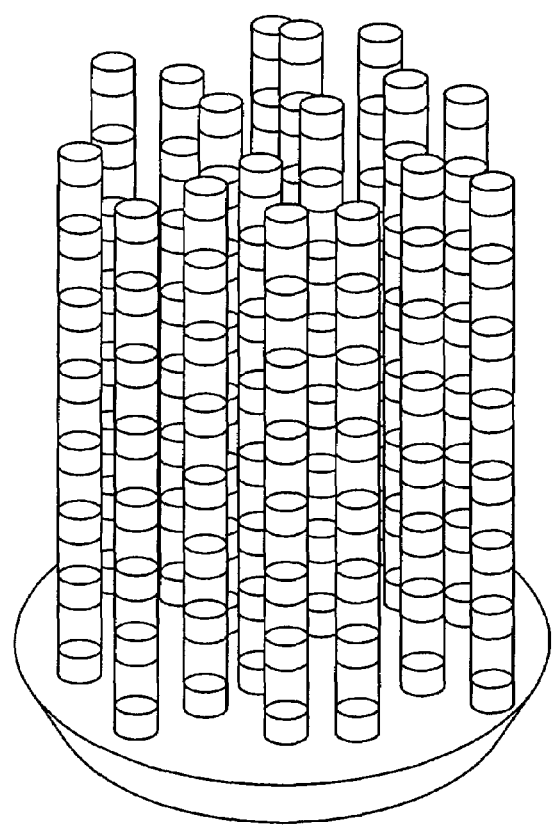

As shown schematically in FIG. 5, rather than one pillar, a plurality of pillars, each having a quantum dot sandwiched between two groups of Bragg reflector layers, can also be generated by utilizing the teachings of the invention.

The pillars can find a variety of applications, for example, formation of fluorophore materials. Uniformly-sized quantum dot structures, can be incorporated in a variety of optoelectronic devices. In one exemplary application discussed below, such pillars, and particularly very wide pillars, can be employed in vertical cavity surface emitting lasers in which the quantum dots form the laser's active region.

Figure 6:
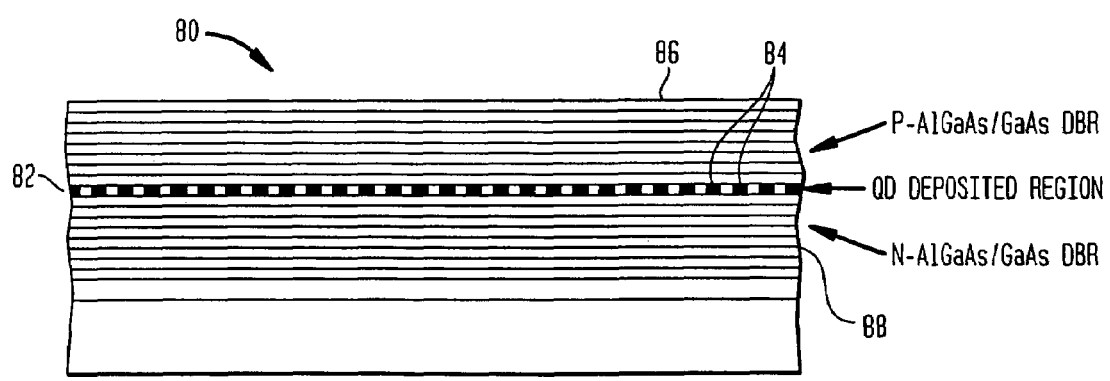
FIG. 6 is an illustration of a vertical cavity surface emitting laser (VCSEL) structure in which quantum dot particles formed according to the teachings of the invention provide an active lasing layer.

By way of example, FIG. 6 schematically illustrates a vertical cavity surface emitting laser (VCSEL) 80 having an active region 82 formed by a plurality of quantum dot nanoparticles 84, which are produced in accordance with the teachings of the invention. The nano-particles 84 are disposed between two distributed Bragg reflector layers 86 and 88 that together form an optical resonator providing high reflectivity of the wavelengths of the lasing radiation emitted by the nanoparticles. While the DBR layer 86 is formed as an alternating stack of p-doped AlGaAs and GaAs layers, the DBR layer 88 is formed as an alternating stack of n-doped AlGaAs and GaAs layers so as to enable operation of the VCSEL as a forward-biased p/n junction device. The VCSEL can further include a pair of electrodes (not shown) for applying a forward-bias voltage across the active region to stimulate generation of lasing radiation by the nanoparticles in a manner known in the art.

In this exemplary embodiment, each nanoparticle 84 includes an InGaAs one-dimensional quantum well that is sandwiched between two GaAs confinement layers. The nano-particles 84 are designed to emit long-wavelength laser radiation, for example, laser radiation having a wavelength of about 1310 nm or 1550 nm. The high uniformity of the nano-particles 84 ensures that the exemplary VCSEL 80 exhibits very narrow spectral width, and potentially single mode emission. In other words, the size uniformity of the nano-particles ensures that they exhibit substantially similar, and preferably identical, emission characteristics, thereby allowing single mode operation of the laser.

Those having ordinary skill in the art will appreciate that a variety of modifications can be made to the above embodiments without departing from the scope of the invention.

What is claimed is:

1. A method of generating one or more quantum dot structures, comprising
   depositing a release layer on a semiconductor substrate,
   forming a semiconductor heterostructure over the release layer, the heterostructure providing confinement of charge carriers therein, said heterostructure comprising at least one distributed Bragg reflector,
   masking a surface of the heterostructure,
   selectively removing the exposed portions of the heterostructure to generate a plurality of separate heterostructure elements each disposed on a remaining portion of the release layer, and
   removing the release layer to release the heterostructure elements as a plurality of quantum dots.

2. The method of claim 1, wherein each of the heterostructure elements provides a three-dimensional confinement of the charge carriers.

3. The method of claim 2, wherein the heterostructure elements are columnar in shape.

4. The method of claim 1, wherein the step of forming the heterostructure further comprises depositing one or more layers of Group III-V semiconductors on the substrate.

5. The method of claim 1, wherein the step of forming the heterostructure further comprises depositing successive layers of GaAs, GaAlAs and GaAs on the substrate.

6. The method of claim 5, wherein each of the successive layers of GaAs, or GaAlAs has an average thickness in a range of about 2 nm to about 300 nm.

7. The method of claim 1, further comprising selecting the substrate to be any of InAsSb, GaAsSb, AlAsSb, GaAs and GaSb.

8. The method of claim 5, wherein the step of depositing successive layers comprises utilizing chemical vapor deposition to deposit the layers.

9. The method of claim 5, wherein the step of depositing the successive layers comprises utilizing molecular beam epitaxial growth techniques.

10. The method of claim 1, wherein the step of applying a mask further comprises applying a plurality of nanoparticles to selectively shield portions of the heterostructure from etching.

11. The method of claim 1, wherein the step of removing the exposed portions further comprises utilizing an etching process selected from the group of reactive ion etching, ion beam etching and combinations thereof to etch away the exposed portions.

12. The method of claim 1, wherein the step of removing the release layer further comprises dissolving the release layer with an acidic solution.

13. The method of claim 1, wherein the release layer is an AlAs compound.

14. The method of claim 1, further comprising utilizing chemical vapor deposition to deposit the release layer.

15. The method of claim 1, further comprising utilizing molecular beam epitaxial growth techniques to deposit the release layer.

16. The method of claim 1, wherein the quantum dot structures exhibit fluorescence in the near-IR portion of the electromagnetic spectrum.

17. The method of claim 1, further comprising selecting the mask to ensure that sizes of the quantum dots vary by less than about 10 percent.

18. A method of generating a plurality of quantum dot structures, comprising
depositing a release layer on a semiconductor substrate,
forming a first reflective structure on the release layer,
generating a quantum well nanostructure on the first reflective structure, and
forming a second reflective structure on the quantum well heterostructure to form a composite structure,
masking portions of the composite structure with a mask,
selectively removing part of the composite structure of the mask to generate pillars, each pillar being disposed on a portion of the release layer and comprising a portion of the composite structure, and
dissolving the release layer to release the pillars as separate quantum dots,
wherein each of the reflective structures comprises a distributed Bragg reflector.

19. A method of generating a plurality of quantum dot structures, comprising
depositing a release layer on a semiconductor substrate,
forming a first reflective structure on the release layer,
generating a quantum well nanostructure on the first reflective structure,
forming a second reflective structure on the quantum well heterostructure to form a composite structure,
masking portions of the composite structure with a mask,
selectively removing part of the composite structure of the mask to generate pillars, each pillar being disposed on a portion of the release layer and comprising a portion of the composite structure, and
dissolving the release layer to release the pillars as separate quantum dots,
wherein at least one reflective structure is N-doped.

20. A The method of generating a plurality of quantum dot structures, comprising
depositing a release layer on a semiconductor substrate,
forming a first reflective structure on the release layer,
generating a quantum well nanostructure on the first reflective structure,
forming a second reflective structure on the quantum well heterostructure to form a composite structure,
masking portions of the composite structure with a mask,
selectively removing part of the composite structure of the mask to generate pillars, each pillar being disposed on a portion of the release layer and comprising a portion of the composite structure, and
dissolving the release layer to release the pillars as separate quantum dots,
wherein at least one reflective structure is P-doped.

21. A method of generating a plurality of quantum dot structures, comprising
depositing a release layer on a semiconductor substrate,
forming a first reflective structure on the release layer,
generating a quantum well nanostructure on the first reflective structure,
forming a second reflective structure on the quantum well heterostructure to form a composite structure,
masking portions of the composite structure with a mask,
selectively removing part of the composite structure of the mask to generate pillars, each pillar being disposed on a portion of the release layer and comprising a portion of the composite structure, and
dissolving the release layer to release the pillars as separate quantum dots,
wherein each of the reflective structures comprises alternating layers of AlGaAs and GaAs.

22. The method of claim 18, further comprising selecting the semiconductor substrate to be GaAs substrate.

23. A method of generating a plurality of quantum dot structures, comprising
depositing a release layer on a doped GaAs substrate,
forming a second reflective structure on the quantum well heterostructure to form a composite structure,
masking portions of the composite structure with a mask,
selectively removing part of the composite structure of the mask to generate pillars, each pillar being disposed on a portion of the release layer and comprising a portion of the composite structure, and
dissolving the release layer to release the pillars as separate quantum dots.

24. The method of claim 18, further comprising selecting the GaAs substrate to be an undoped GaAs substrate.

25. A method of generating a plurality of quantum dot structures, comprising
forming a quantum well heterostructure on a release layer disposed on a semiconductor wafer, the quantum well heterostructure confining selected charged carriers, wherein said heterostructure comprises at least one distributed Bragg reflector,
applying a mask to a portion of the quantum well heterostructure,
selectively etching part of the quantum well heterostructure to form heterostructure pillars each confining the selected charged carriers, and
releasing the heterostructure pillars to form the quantum dot structures.

26. The method of claim 25, wherein the step of releasing the heterostructures further comprises dissolving the release layer.

27. A method of generating a plurality of quantum dot structures, comprising:
generating a stack comprising a plurality of alternating layers of a quantum well heterostructures and release layers on a semiconductor substrate,
etching selected portions of the stack to generate a plurality of columnar structures on the substrate, each columnar structure comprising a plurality of quantum dots each formed from the quantum well heterostructure and separated from an adjacent quantum dot by a remaining portion of one of the release layers, and
dissolving the remaining portions of the release layers to release the quantum dots.

* * * * *